United States Patent
Murakami et al.

(10) Patent No.: US 7,837,791 B2
(45) Date of Patent: Nov. 23, 2010

(54) SILICON SINGLE CRYSTAL WAFER FOR PARTICLE MONITOR

(75) Inventors: Hiroki Murakami, Tokyo (JP); Masahiko Okui, Tokyo (JP); Hiroshi Asano, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 39 days.

(21) Appl. No.: 12/153,726

(22) Filed: May 23, 2008

(65) Prior Publication Data
US 2008/0236476 A1 Oct. 2, 2008

Related U.S. Application Data

(63) Continuation of application No. 10/601,576, filed on Jun. 24, 2003, now abandoned.

(30) Foreign Application Priority Data

Aug. 27, 2002 (JP) .............................. 2002-247363

(51) Int. Cl.
*C30B 15/22* (2006.01)
(52) U.S. Cl. ................ 117/13; 117/2; 117/14; 117/20; 117/19
(58) Field of Classification Search ...................... 117/2, 117/13, 14, 19, 20; 423/328.2
See application file for complete search history.

(56) References Cited

U.S. PATENT DOCUMENTS

| | | | |
|---|---|---|---|
| 5,931,662 A | 8/1999 | Adachi et al. | |
| 6,120,598 A | 9/2000 | Iida et al. | |
| 6,139,625 A | 10/2000 | Tamatsuka et al. | |
| 6,284,384 B1 * | 9/2001 | Wilson et al. | 428/450 |
| 6,413,310 B1 | 7/2002 | Tamatsuka et al. | |
| 2002/0100410 A1 * | 8/2002 | Kim et al. | 117/13 |
| 2002/0157598 A1 * | 10/2002 | Hoshi et al. | 117/13 |

FOREIGN PATENT DOCUMENTS

| | | |
|---|---|---|
| JP | 2000-053489 | 2/2002 |
| WO | WO 00/12786 A1 | 3/2000 |
| WO | WO 0173169 A1 * | 10/2001 |

\* cited by examiner

*Primary Examiner*—Robert M Kunemund
(74) *Attorney, Agent, or Firm*—Clark & Brody

(57) ABSTRACT

A silicon single crystal wafer for a particle monitor is presented, which wafer has an extremely small amount in the surface density of light point defects and is capable of still maintaining a small surface density even after repeating the SC-1. The wafer is prepared by slicing a silicon single crystal ingot including an area in which crystal originated particles are generated, and the surface density of particles having a size of not less than 0.12 mum is not more than 15 counts/cm$^2$ after repeating the SC-1. More preferably, a silicon single crystal wafer having a nitrogen concentration of $1 \times 10^{13}$ $1 \times 10^{15}$ atoms/cm$^3$ provides a surface density of not more than 1 counts/cm$^2$ for the particles having a diameter of not less than 0.12 mum even after repeating the SC-1. Hence, a high quality wafer optimally used for a particle monitor can be obtained and a very small number of defects in the wafer make it possible to produce devices.

7 Claims, 2 Drawing Sheets

SILICON SINGLE CRYSTAL WAFER FOR PARTICLE MONITOR

This is a continuation of U.S. Ser. No. 10/601,576 filed Jun. 24, 2003 now abandoned.

BACKGROUND OF THE INVENTION

1. Field of the Invention

The present invention relates to a silicon single crystal wafer for a particle monitor, which is used as a semiconductor material, and more specifically to a silicon single crystal wafer for a particle monitor, which has an extremely small surface density of light point defects (hereinafter referred to as "LPDs") on the wafer surface, even when it is repeatedly used.

2. Description of the Prior Art

As a method for producing a silicon single crystal which is used for a silicon wafer of semiconductor material, the Czochralski method (hereinafter referred to as "the CZ method"), the floating-zone method (the FZ method) or the like is employed. Of these methods, a method for growing a single crystal with the CZ method is most frequently employed.

FIG. 2 is a schematic sectional view of a conventional apparatus for producing a silicon single crystal with the CZ method. A method for growing a single crystal by utilizing the single crystal producing apparatus shown in FIG. 2 will be described as follows:

A polycrystalline silicon material is put in a quartz crucible 3 which is mounted in a graphite crucible 4 surrounded by a thermal insulator 6, and then the silicon material is heated by a heater 5 to form a molten silicon material in the quartz crucible. Thereafter, a seed (seed crystal) 1 is immersed into the molten silicon material, and the seed is pulled up in the state in which the seed and crucible are rotated. By the pulling a silicon single crystal 2 is grown in a state in which it is surrounded by a thermal shield 7. In this case, the crucibles 3 and 4 are rotated either in the same direction as that of the single crystal or in the direction opposite thereto.

In the growth of the single crystal 2 by the CZ method, a seed diameter reduction, i.e., the process of reducing the diameter of the seed crystal, is carried out in order to obtain a dislocation-free single crystal, and subsequently the shoulder part is formed so as to grow the single crystal having a predetermined diameter at the body portion, i.e., the body diameter. After altering the shape of the shoulder, the single crystal having a fixed body diameter is grown. After growing the single crystal having a predetermined length, a tail portion is formed in the single crystal such that the diameter thereof is reduced. Then, the process of growing the single crystal 2 is finished.

Wafers for an integrated circuit device of semiconductor are prepared by slicing the silicon single crystal thus produced. In particular, the design rule of 0.13 um size (the pattern width is 0.13 um) is applied to the current devices, and the quality demands of silicon wafer for producing such a device becomes significantly severe.

In the process of producing devices according to the modern device rule as above, a very severe control of particles on the wafer surface is carried out. In this case, the number of particles is measured by a particle counter, and it is required that the surface density of particles becomes extremely small.

In order to produce a silicon single crystal wafer for a particle monitor including a small amount of the COPs (crystal originated particles) regarded as crystal defects, the speed of growing the single crystal is decreased to confine annular oxidation-induced stacking faults (hereinafter referred to as "annular OSFs") in the single crystal. Thereafter, the wafer can be prepared from the single crystal by selectively slicing it at areas in which no COPs are generated on the surface.

However, a decrease in the growth rate of a silicon single crystal causes the productivity to be reduced, and thereby the cost of manufacturing a single crystal to be increased. Accordingly, this method cannot be employed in the manufacture of a silicon single crystal for a particle monitor.

Furthermore, a method is disclosed for decreasing the number of particles which may be counted by a particle monitor, together with a decrease in the size of COPs by doping a single crystal with nitrogen during the crystal growth.

For instance, Japanese Patent Application Laid-open No. 2000-53489 discloses a method for producing a silicon single crystal wafer for a particle monitor, wherein the single crystal is grown with the CZ method by doping a single crystal rod with nitrogen at a nitrogen concentration of $1 \times 10^{10}$-$5 \times 10^{15}$ atoms/cm$^3$.

In accordance with an example reported in the above specification, it is shown that, for a 6-inch diameter wafer which is cleaned for 60 min with the Standard Cleaning-1 (hereinafter referred to as "SC-1"), which is made by using alkaline chemical liquid mainly containing $NH_4OH$, $H_2O_2$, and $H_2O$ the surface density of particles having a diameter of not less than 0.13 um is about 1200 counts/cm$^2$ when nitrogen is not doped, whereas it becomes about $\frac{1}{20}$ of the above surface density when nitrogen is doped. In accordance with the description of the example, it is estimated that the surface density of particles having a size of not less than 0.13 um is not more than 60 counts/cm$^2$. In recent years, a wafer having such a greater surface density as in this estimation can hardly be used as a wafer for manufacturing devices.

Since a wafer for a particle monitor is repeatedly used in the current process of manufacturing devices, it is desirable that the wafer still has a small surface density even after repeating the cleaning. However, in the conventionally used wafer for a particle monitor, it is found that, even if the wafer has a small surface density in the initial usage, the surface density increases in the repeated usage.

It is conceivable that this problem results from the following two facts [1] and [2]:

[1] When COP having such relatively small size as undetectable with the particle counter on the wafer surface in the initial stage is repeatedly cleaned, the particle size of COPs increases due to the etching effect in the cleaning to form a pit which can be detected as LPD by the particle counter, thereby enabling the count of particles to be increased.

[2] The wafer is subjected to various heat treatments in the course of repeated usages, so that oxygen precipitates are generated on the wafer surface to eventually provide crystalline defects due to oxygen, i.e., BMDs (bulk micro defects). These defects are detected by the particle counter, thereby causing the surface density of particles to be increased.

SUMMARY OF THE INVENTION

In view of these facts, it is an object of the present invention to provide a silicon single crystal wafer for a particle monitor, wherein the number of LPDs per unit wafer surface (hereinafter referred to as "LPD density") is extremely small, even after it is repeatedly used.

In order to overcome the above-mentioned problems, the present inventors experimentally studied the problems of the techniques for producing a silicon single crystal in the prior art, and succeeded in ascertaining the following facts (a)-(d) on the growth process:

(a) In the crystal growth where a silicon single crystal ingot is pulled up from the molten silicon material, a decreased time period of the single crystal ingot passing a predetermined temperature range allows the number of particles to be reduced after cleaning the surface of the wafer for a particle monitor, which wafer is prepared by slicing the ingot.

(b) The size of COPs may be decreased, if the time period of the silicon single crystal ingot passing a temperature range from 1150° C. to 1070° C. is within 20 min. Furthermore, the generation of BMDs is suppressed, if the time period of the silicon single crystal passing a temperature range from 900° C. to 800° C. is within 40 min.

(c) Doping of nitrogen in the process (b) allows the size of the COPs to be further decreased.

(d) A decreased oxygen concentration in the process (b) or (c) allows the generation of BMDs to be further suppressed.

The present invention is provided on the basis of the above-mentioned facts (a)-(d), and the gist of the present invention resides in the following silicon single crystal wafers (1) to (4) which are grown with the CZ method:

(1) In accordance with a first aspect of the invention, a silicon single crystal wafer for a particle monitor is provided, wherein said wafer is prepared by slicing a silicon single crystal ingot grown by the Czochralski method, wherein said wafer includes an area in which crystal originated particles are generated, wherein a surface density of particles having a particle size of not less than 0.12 um on the wafer surface is not more than 15 counts/cm$^2$, even after repeating the Standard Cleaning-1.

(2) In accordance with a second aspect of the invention, a silicon single crystal wafer for a particle monitor is provided, wherein said wafer is prepared by slicing a silicon single crystal ingot grown by the Czochralski method, wherein said wafer includes an area in which crystal originated particles are generated, and further said silicon single crystal ingot has a nitrogen concentration of $1 \times 10^{13}$-$1 \times 10^{15}$ atoms/cm$^3$, wherein a surface density of particles having a particle size of not less than 0.12 um on the wafer surface is not more than 1 count/cm$^2$, even after repeating the Standard Cleaning-1.

(3) In accordance with a third aspect of the invention, a silicon single crystal wafer for a particle monitor is provided, wherein said wafer is prepared by slicing a silicon single crystal ingot grown by the Czochralski method, wherein, in said Czochralski method, the time period of passing the temperature range from 1150° C. to 1070° C. is within 20 min and the time period of passing the temperature range from 900° C. to 800° C. is within 40 mm, wherein a surface density of particles having a particle size of not less than 0.12 um on the wafer surface is not more than 15 counts/cm$^2$, even after repeating the Standard Cleaning-1.

(4) In accordance with a fourth aspect of the invention, a silicon single crystal wafer for a particle monitor is provided, wherein said wafer is prepared by slicing a silicon single crystal ingot grown by the Czochralski method, wherein, in said Czochralski method, the time period of passing the temperature range from 1150° C. to 1070° C. is within 20 min and the time period of passing the temperature range from 900° C. to 800° C. is within 40 min, wherein said silicon single crystal ingot has a nitrogen concentration of $1 \times 10^{13}$-$1 \times 10^{15}$ atoms/cm$^3$, wherein a surface density of particles having a particle size of not less than 0.12 um on the wafer surface is not more than 1 count/cm$^2$, even after repeating the Standard Cleaning-1.

It is desirable that the silicon single crystal wafer for a particle monitor defined in anyone of the above aspects (1) to (4) has an oxygen concentration of not more than $13 \times 10^{17}$ atoms/cm$^3$ (old ASTM).

The term "after repeating the cleaning" used herein means that after the wafer surface is several times cleaned with a SC-1 cleaning solution (in the content of the solution $H_2O_2$:$NH_4OH$:$H_2O$=1:1:5, and for example, this cleaning is carried out for 10 min in each of six cleanings.

The term "the number of particles per unit surface area of the wafer" used herein means that the value is determined by dividing the number of particles observed on the wafer surface with a particle counter by the unit surface area of the wafer.

Other objects, features and advantages of the present invention will become apparent from the following description of the preferred embodiments with reference to the accompanying drawings.

DESCRIPTION OF THE PREFERRED EMBODIMENTS

Figure 1:
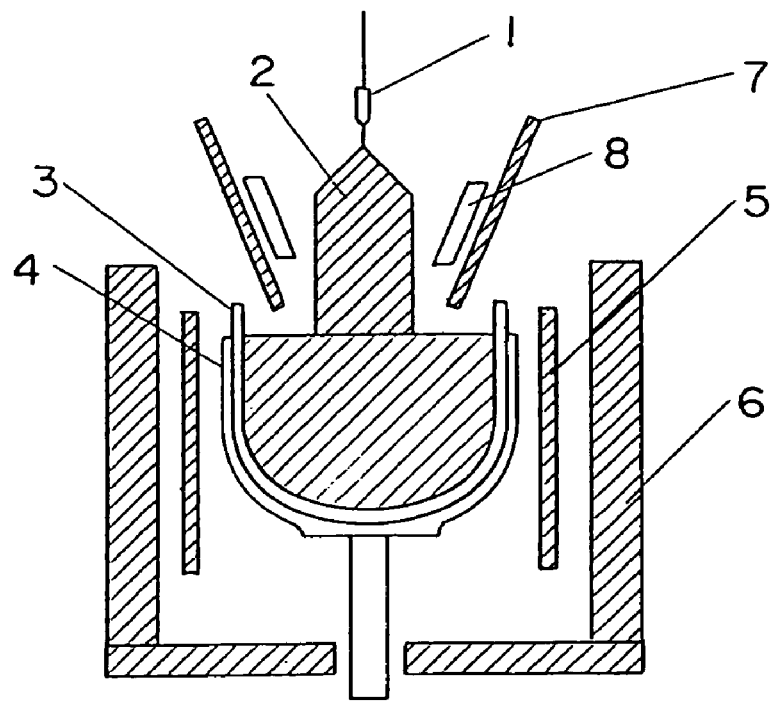
FIG. 1 is a schematic sectional view of an apparatus for manufacturing a silicon single crystal in accordance with the invention.
Figure 2:
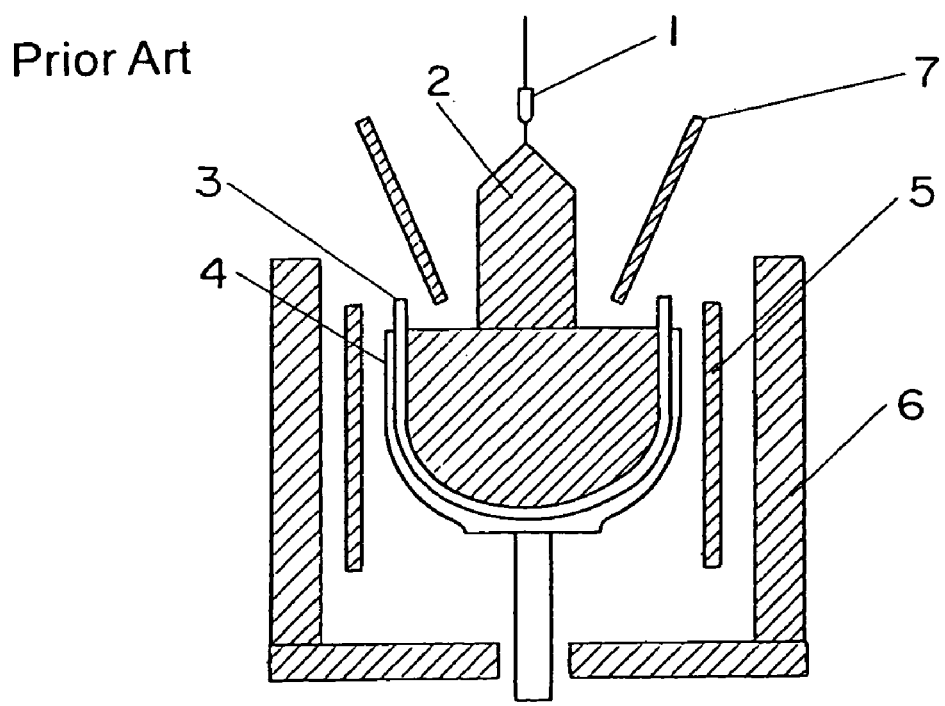
FIG. 2 is a schematic sectional view of an apparatus for manufacturing a silicon single crystal in the prior art.

Referring now to the accompanying drawings, the present invention will be described in detail.

A silicon single crystal wafer for a particle monitor according to the invention is prepared without nitrogen doping by the SC-1 cleaning for one hour, e.g., six times cleaning each for 10 min, such that the surface density of particles having a diameter of not less than 0.12 um becomes not more than 15 counts/cm$^2$. Accordingly, the wafer is particularly useful for using a particle monitor.

Firstly, the reason why it is required that the surface density of particles having a diameter of not less than 0.12 um is not more than 15 counts/cm$^2$ will be described.

In the current process of manufacturing devices, a design rule in such a size of 0.13 um, as described above, is employed, and the particles having a diameter of the same size as that in the pattern width in the time of manufacturing devices significantly deteriorates the device quality. This provides a limitation to the particle size of not less than 0.12 um in the invention.

In the experimental investigation on the device quality of a wafer prepared by the repeated cleaning, it is confirmed that the wafer is sufficiently useful in the device process, so long as the surface density of particles having such a diameter is not more than 15 counts/cm$^2$. Accordingly, it is preferable that the surface density should be as small as possible. This is a reason why the selected surface density should be not more than 15 counts/cm$^2$.

In the growth method for pulling a silicon single crystal ingot according to the invention, the time period for passing a temperature range from 1150° C. to 1070° C. and the time period for passing a temperature range from 900° C. to 800° C. are both controlled to be restricted respectively within predetermined time durations.

In the temperature range from 1150° C. to 1070° C., COPs are apt to be generated in the silicon single crystal ingot. Accordingly, a decrease in the time period passing this temperature range allows COPs to be retained in a small size. A time period of more than 20 min causes the size of COPs to be increased, so that the surface density of particles observed on the wafer surface after the cleaning increases. In view of this fact, the time period passing the temperature range from 1150° C. to 1070° C. should be selected to be within 20 min.

The single crystal ingot is further cooled from 900° C. to 800° C. At this temperature range, BMDs are apt to be formed in the silicon single crystal. Accordingly, a decrease in the time period passing this temperature range allows the generation of BMDs to be suppressed.

A time period of more than 40 min makes it impossible to suppress the generation of BMDs, so that the surface density of particles observed on the surface of a wafer after the cleaning increases. In view of this fact, the time period passing the temperature range from 900° C. to 800° C. should be selected to be within 40 min.

Furthermore, preferred embodiments of a silicon single crystal for a particle monitor according to the invention will be described.

The doping of the single crystal with nitrogen allows a surface density of particles having a diameter of not less than 0.12 um to become not more than. 1 count/cm$^2$ after the SC-1 cleaning for one hour. This is due to the fact that the doping of nitrogen causes the size of COPs to be further reduced, thereby enabling the measured surface density of particles to be further decreased, compared with that in the case where no nitrogen is doped.

A nitrogen concentration of not less than $1 \times 10^{13}$ atoms/cm$^3$ provides the above-described effect. On the other hand, nitrogen also provides an undesirable effect of promoting the generation of BMDs. In fact, a marked increase in the generation of BMDs may be found at a nitrogen content of more than $1 \times 10^{15}$ atoms/cm$^3$. It can be stated, therefore, that an excessive nitrogen content provides an increase in the surface density of particles observable on the wafer surface. In addition, the excessive nitrogen content causes dislocations to be generated in a dislocation-free single crystal, thereby making it impossible to further pull up the single crystal in the crystal growth. In view of this fact, it is preferable that the nitrogen concentration should be set $1 \times 10^{13}$-$1 \times 10^{15}$ atoms/cm$^3$, when nitrogen is doped.

The nitrogen doping in the invention can be carried out with a conventional method, such as, for instance, the addition of nitride either to an initial material of polycrystalline silicon or to a molten silicon material, the growth of a single crystal under a nitrogen or nitrogen compound gas atmosphere, the spraying of nitrogen or nitrogen compound gas onto a polycrystalline silicon material before melting, or the like.

The silicon single crystal wafer for a particle monitor according to the invention is pre-pared from a silicon single crystal ingot by slicing an area in which COPs are generated. This is due to the fact that the manufacture of a single crystal including the generated COP areas makes it possible to eliminate annular OSFs at the center of the crystal plane, and therefore the pulling rate can be significantly increased, compared with the manufacture of a single crystal including areas in which COPs are not generated.

Therefore, in the case of manufacturing a wafer, the preparation of the wafer from a single crystal by cutting an area in which COPs are generated provides a great enhancement in the productivity, compared with the cutting of an area without any generation of COPs.

In order to rapidly and stably obtain a single crystal including an area in which COPs are generated, it is preferable that the ratio V/G of the crystal growth speed V (mm/min) to the temperature gradient G (° C./min) at the center of the crystal in the crystal pulling axis from the melting point of silicon to 1350° C. should be not less than 0.20 (mm$^2$/min/° C.).

Moreover, in a preferred embodiment of the silicon single crystal wafer for a particle monitor according to the invention, it is preferable if the oxygen concentration in a single crystal wafer is not more than $13 \times 10^{17}$ atoms/cm$^3$ to suppress the generation of BMDs and therefore to suppress the generation of oxygen precipitates on the wafer surface. In conjunction with this fact, a method for regulating the speed of revolution for a crucible, a method for regulating the pressure in the pulling furnace, or the others can be employed to decrease the oxygen concentration in the single crystal.

EXAMPLES

Several experiments on single crystal wafers for a particle monitor were made, in which a silicon single crystal was grown with the pulling method, and the wafers were prepared from the single crystals by slicing them.

Example 1

FIG. 1 is a schematic sectional view of an apparatus for producing a silicon single crystal with the CZ method, and the apparatus was used to realize the present invention. The procedure for growing the single crystal using the apparatus shown in FIG. 1 was as follows:

A polycrystalline silicon material was put in a quartz crucible 3, and heated by a heater 5 to produce a molten silicon material in the quartz crucible 3. Thereafter, a seed 1 was immersed in the molten silicon, and then pulled up so as to grow a silicon single crystal 2 under the conditions that the seed 1 and crucible 3 were both rotated.

A rapid cooling system 8 was disposed in the inside of a thermal shield 7 in such a way that the silicon single crystal thus pulled was partially cooled in a compulsive manner. In the rapid cooling system 8, a cooling medium was circulated therein so as to provide a predetermined temperature distribution for the silicon single crystal in the axial direction. Furthermore, the rapid cooling system 8 was equipped with a function for controlling the time duration of passing a specified area in the temperature distribution.

A high purity polycrystalline silicon having a weight of 140 kg was put in the crucible 3 shown in FIG. 1, and further boron (B) for a p type dopant was added thereto so as to obtain a single crystal having an electrical resistance of 10 Ωcm. The inside of the apparatus was maintained under an argon reduced pressure atmosphere (argon partial pressure: not more than $1.33 \times 10^4$ Pa), and the silicon material was molten by the heater 5.

A seed crystal 1 mounted to a seed chuck was immersed into the molten silicon material, and the seed 1 was pulled up in the state in which the crucible 3 and the pulling axis were both rotated. In this case, the crystal orientation <100> was selected and, in order to obtain a dislocation free single crystal, the diameter of the crystal at the seed was reduced to form a shoulder portion. Subsequently, the shape of the shoulder was altered so as to obtain a single crystal having a target body diameter.

The pulling rate in the crystal growth was adjusted to be 1.3 mm/min at a body length of 100 mm, and finally an 8-inch diameter single crystal having a body length of 1700 mm was produced.

The temperature gradient in the axial direction of the single crystal center was 5.5° C./min during a temperature-decreasing phase from the melting point to 1350° C. in the pulling state. In this case, the time period for passing the temperature range from 1150° C. to 1070° C. was 13 min and the time period for passing the temperature range from 900° C. to 800° C. was 28 min.

The growth of a single crystal doped with nitrogen was carried out under the same pulling conditions. The doping of nitrogen in the single crystal was carried out by doping the molten silicon material with nitrogen such that the nitrogen concentration at the top of the body of the single crystals became $1 \times 10^{14}$ atoms/cm$^3$.

From the silicon single crystals thus produced, wafer samples were prepared by slicing each of the wafers at three axial positions of 300 mm, 500 mm and 1000 mm in the body of the single crystals and by performing predetermined wafer finishing processes, such as chamfering, lapping, etching, mirror grinding and others.

From the wafers without nitrogen doping, test samples 1-1, 1-2 and 1-3 were prepared and from the wafers with nitrogen doping test samples 1-4, 1-5 and 1-6 were prepared. The oxygen concentration in these wafer samples was not more than $13 \times 10^{17}$ atoms/cm$^3$ (old ASTM).

Each of the wafer samples thus prepared was six times cleaned, each for 10 min, with the SC-1 cleaning solution (the chemical components of the solution: $H_2O_2:NH_4OH:H_2O=1:1:5$). After each of the cleanings, the number of LPDs on the wafer surface was measured, using a laser particle counter. The results of measurement are shown in FIG. 3.

Figure 3:
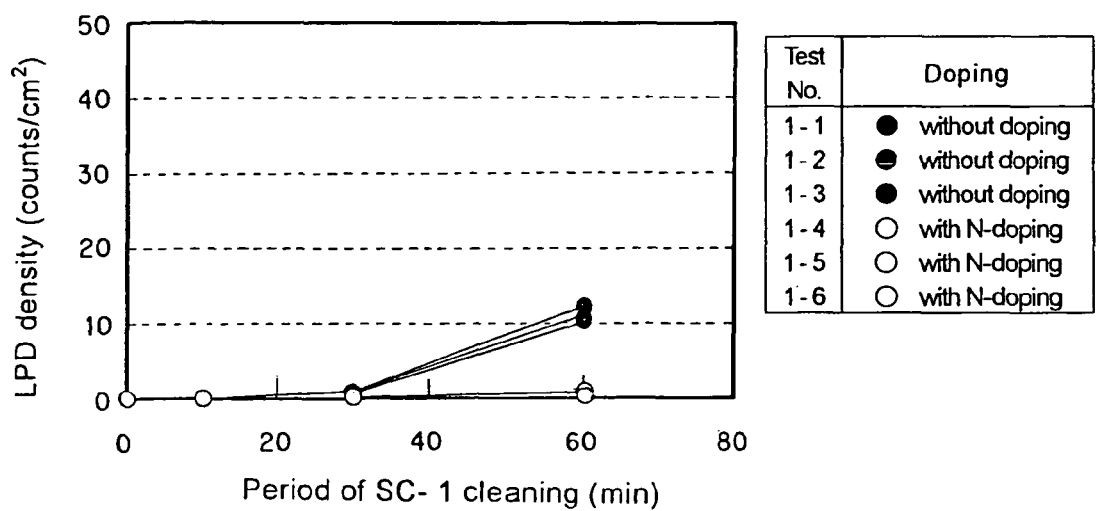
FIG. 3 is a diagram showing the relationship between the cleaning period and the density of LPDs after the cleaning, applying the SC-1 cleaning thereto.

From the results in FIG. 3, it is clear that the surface density of LPDs having a particle diameter of not smaller than 0.12 um is not more than 0.05 counts/cm$^2$ for all of the wafer samples 1-1 to 1-6 independent of the amount of nitrogen contained in the single crystal. It is also found that the surface density of LPDs having a particle diameter of not smaller than 0.12 um is not more than 1 count/cm2 for all of the wafer samples 1-1 to 1-6 when the cleaning is three times carried out (the total cleaning time: 30 min).

Furthermore, it is found that, even after the cleaning is six times carried out (the total cleaning time: 60 min), the surface density of LPDs having a particle diameter of not less than 0.12 um is 10 counts/cm$^2$ or so for wafer samples 1-1 to 1-3, which are prepared from the single crystal containing no nitrogen. As a result, it can be recognized that these wafer samples can be effectively used as a wafer for a particle monitor, which has such an excellent quality as in a surface density of not more than 15 counts/cm$^2$.

Moreover, the surface density of LPDs having a particle diameter of not more than 0.12 um is not more than 1 count/cm$^2$ for the wafer samples 1-4 to 1-6, which are prepared from the single crystal containing nitrogen. It can be stated, therefore, that these wafer samples can be used as a wafer for a particle monitor, which has much more excellent quality.

Example 2

In the following, experimental studies on the effect of the time period of passing a temperature range from 1150° C. to 1070° C. and the time period of passing the temperature range from 900° C. to 800° C. were made.

P-type 8-inch diameter silicon single crystals having a crystal orientation <100>, an electrical resistance of 10 Ωcm and an oxygen concentration of not more than $12.3 \times 10^{17}$ atoms/cm$^3$ (old ASTM) were grown, as similarly to Example 1.

Each of wafers prepared from the single crystals by slicing them was cleaned for 60 min with the SC-1 cleaning, and then the surface density of LPDs was measured for the wafer.

After measuring the surface density of LPDs, each wafer sample was subjected to a heat treatment for precipitation evaluation under an oxygen atmosphere for one hour at 800° C. and for 16 hours at 1000° C. Thereafter, the wafer sample was cleaved along a surface perpendicular to the wafer surface, and the surface thus cleaved was etched by immersing the wafer into a wright etchant (a mixed solution of $HF+HNO+CrO_3+Cu(NO_3)2+H_2O+CH_3COOH$) for 3 min, and then, using an optical microscope, BMDs on the cleavage surface were observed at a magnification of ×40 to determine the number of BMDs per unit surface area (hereinafter referred to as "the BMD density").

In Table 1, the experimental conditions, the surface density of LPDs after the SC-1 cleaning and the BMD density for each wafer specimen are summarized.

TABLE 1

| Test Number | Time Period of Passing Temperature Range from 1150° C. to 1070° C. (min) | Time Period of Passing Temperature Range from 900° C. to 800° C. (min) | Oxygen Concentration ($\times 10^{17}$ atoms/cm$^3$) | V/G (mm$^2$/min/° C.) | LPD Density after SC-1 Cleaning (*1) (counts/cm$^2$) | BMD Density (counts/cm$^2$) |
|---|---|---|---|---|---|---|
| 2-1 | 32 | 58 | 12.3 | 0.24 | 25.8 | $9.0 \times 10^4$ |
| 2-2 | 23 | 45 | 12.3 | 0.24 | 20.4 | $7.2 \times 10^4$ |
| 2-3 | 15 | 45 | 12.3 | 0.24 | 17.1 | $7.5 \times 10^4$ |
| 2-4 | 23 | 34 | 12.3 | 0.24 | 17.5 | $4.5 \times 10^4$ |
| 2-5 | 20 | 40 | 12.3 | 0.24 | 14.1 | $4.1 \times 10^4$ |
| 2-6 | 16 | 36 | 12.3 | 0.24 | 13.2 | $4.0 \times 10^4$ |
| 2-7 | 13 | 28 | 12.3 | 0.24 | 10.7 | $3.7 \times 10^4$ |

(Note)
(*1): LDP density after carrying out six times SC-1 cleanings (for 10 min in each cleaning).

Specimens of test numbers 2-1 to 2-4 pertain to the comparative example, where either the time period of passing the temperature range from 1150° C. to 1070° C. or the time period of passing the temperature range from 900° C. to 800° C. resides outside the range defined by the present invention, whereas specimens of test numbers 2-5 to 2-7 pertain to the inventive example, where the above-mentioned two time periods reside in the range defined by the present invention.

The specimens of test numbers 2-1 to 2-4 in the comparative example exhibit LPD densities of more than 15 counts/cm² after cleaning with the SC-1 cleaning solution for 60 min.

On the contrary, the specimens of test numbers 2-5 to 2-7 in the inventive example exhibit LPD densities of not more than 15 counts/cm² and a small BMD density in the inside of the wafer. It can be stated, therefore, that these specimens are used as a wafer for a particle monitor.

As described above, in accordance with the wafer for a particle monitor according to the present invention, the initial surface density of LPDs observed on the wafer surface is extremely small, and further the surface density of LPDs may still be maintained sufficiently small even after repeating the SC-1 cleanings. As a result, a high quality wafer for a particle monitor can be produced and can be applied to the manufacture of a wafer having a reduced amount of defects, which wafer is suitable for manufacturing devices.

What is claimed is:

1. A method of making a silicon single crystal wafer for a particle monitor comprising the steps of,
   growing an ingot by the Czochralski method, wherein a time period of passing the ingot through a temperature range from 1150° C. to 1070° C. is controlled to be within 20 minutes and a time period of passing the ingot through a temperature range from 900° C. to 800° C. is controlled to be within 40 minutes, wherein said silicon single crystal ingot has a nitrogen concentration of $1\times10^{13}$-$1\times10^{15}$ atoms/cm³,
   wherein said wafer is prepared by slicing a silicon single crystal ingot into wafers,
   the sliced wafer comprising a wafer body having a density of COP's and BMD's along an entire thickness of the wafer body, and
   wherein a density of particles per unit area having a particle size of not less than 0.12 μm across the entire thickness of the wafer is not more than 1 counts/cm², even after repeating a Standard Cleaning-1.

2. The method of claim 1, wherein said wafer has an oxygen concentration of not more than $13\times10^{17}$ atoms/cm³ (old ASTM).

3. The method of claim 2, wherein a part of a surface portion of the wafer is removed by subjecting the wafer to a Standard Cleaning-1 six times, wherein each cleaning is carried out for 10 minutes, to produce a remaining surface portion on the wafer, the remaining surface portion still having the surface density of crystal-originated particles of not more than 1 counts/cm².

4. The method of claim 1, wherein the wafers are used as particle monitors.

5. The method of claim 3, wherein the wafers are used as particle monitors.

6. The method of claim 1, further comprising the steps of taking the ingot once made and slicing it into wafers, and taking the sliced wafers and subjecting the wafers to finishing operations that include one or more of chamfering, lapping, etching, and mirror grinding.

7. The method of claim 3, further comprising the steps of taking the ingot once made and slicing it into wafers, and taking the sliced wafers and subjecting the wafers to finishing operations that include one or more of chamfering, lapping, etching, and mirror grinding.

* * * * *